US011275278B2

(12) United States Patent
Ito et al.

(10) Patent No.: US 11,275,278 B2
(45) Date of Patent: Mar. 15, 2022

(54) ELECTRO-OPTICAL DEVICE AND ELECTRONIC APPARATUS

(71) Applicant: SEIKO EPSON CORPORATION, Tokyo (JP)

(72) Inventors: Satoshi Ito, Eniwa (JP); Takuto Watanabe, Chitose (JP)

(73) Assignee: SEIKO EPSON CORPORATION, Tokyo (JP)

( * ) Notice: Subject to any disclaimer, the term of this patent is extended or adjusted under 35 U.S.C. 154(b) by 465 days.

(21) Appl. No.: 16/385,311

(22) Filed: Apr. 16, 2019

(65) Prior Publication Data

US 2019/0317345 A1  Oct. 17, 2019

(30) Foreign Application Priority Data

Apr. 17, 2018 (JP) .............................. JP2018-078915
Dec. 20, 2018 (JP) .............................. JP2018-238107

(51) Int. Cl.
*G02F 1/1343* (2006.01)
*G02F 1/1335* (2006.01)

(52) U.S. Cl.
CPC ...... *G02F 1/1343* (2013.01); *G02F 1/133512* (2013.01)

(58) Field of Classification Search
CPC ............. G02F 1/133512; G02F 1/1362; G02F 1/136209; H01L 27/1248; H01L 27/1255; H01L 29/78648; H01L 29/78633; H01L 29/78621

See application file for complete search history.

(56) References Cited

U.S. PATENT DOCUMENTS

| 2009/0065780 A1* | 3/2009 | Yasukawa ......... H01L 29/78633 257/71 |
| 2012/0249911 A1* | 10/2012 | Kamino ............ G02F 1/136209 349/42 |
| 2017/0191868 A1* | 7/2017 | Kurth .................... G01J 5/0245 |

FOREIGN PATENT DOCUMENTS

JP          2012-208449 A      10/2012

* cited by examiner

*Primary Examiner* — Michael H Galey
*Assistant Examiner* — Agnes Dobrowolski
(74) *Attorney, Agent, or Firm* — Oliff PLC

(57) ABSTRACT

In an electro-optical device, inside an insulating layer, a cavity is provided which extend in a thickness direction at both sides in a width direction of a semiconductor layer and at both sides in a length direction of the semiconductor layer and surround the semiconductor layer in a plan view. The cavity is provided, in the thickness direction, from a position on the first substrate side relative to the semiconductor layer to a position on a pixel electrodes side relative to the semiconductor layer. The semiconductor layer is positioned behind at least one of a second light-shielding layer and the cavity when viewed from any direction on the first substrate side. The cavity is provided up to a position on the pixel electrode side relative to a gate electrode provided at the pixel electrode side relative to the semiconductor layer of a transistor, toward the pixel electrodes.

13 Claims, 9 Drawing Sheets

ELECTRO-OPTICAL DEVICE AND ELECTRONIC APPARATUS

The present application is based on and claims priorities from JP Application Serial Number 2018-238107, filed Dec. 12, 2018, and 2018-078915, filed on Apr. 17, 2018, the disclosure of which is hereby incorporated by reference herein in its entirety.

BACKGROUND

1. Technical Field

The present disclosure relates to an electro-optical device provided with a transistor at one side of a substrate, an electronic apparatus, and a manufacturing method of the electro-optical device.

2. Related Art

An electro-optical device (liquid crystal device) used as, for example, a light valve of a projection-type display device is provided with a semiconductor layer between a substrate and a pixel electrode, and the semiconductor layer is utilized to configure a transistor. In such an electro-optical device, when light from a light source is incident on the semiconductor layer, or when an optical feedback formed as a result of light output from the electro-optical device entering again the electro-optical device after being reflected by an optical element and the like is incident on the semiconductor layer, an optical leakage current is generated in the transistor, resulting in a cause of a malfunction and the like of the transistor. Therefore, a structure is proposed in which the semiconductor layer is disposed to overlap, in a plan view, with a light-shielding wiring disposed between the semiconductor layer and the pixel electrode, and in which a light-shielding layer is disposed to overlap, in a plan view, with the semiconductor layer between the semiconductor layer and the substrate. At the same time, a technology is proposed in which, air spaces are disposed at both sides in a width direction of the semiconductor layer in an area between a non-aperture region overlapping, in a plan view, with the light shielding wiring and an aperture region surrounded by the light shielding wiring, and reflection at a boundary surface between the air spaces and an insulating film is utilized to prevent light from being incident from the aperture region to the semiconductor layer(see JP-A-2012-208449).

However, there is a problem in a configuration described in FIG. 4 of JP-A-2012-208449, that, in the area from the non-aperture region and the aperture region, the air space (insulation unit 411) is disposed only in a region in a width direction of a channel part 308 of the transistor, and thus, it is not possible to shield, with the air space, light advancing toward the semiconductor layer from a length direction of the semiconductor layer of the transistor, a direction inclined diagonally relative to the length direction, a width direction other than the channel part of the semiconductor layer, and a direction inclined diagonally relative to the width direction other than the channel part. Therefore, in the configuration described in JP-A-2012-208449, it is difficult to sufficiently prevent occurrence of an optical leakage current. Note that FIG. 10 of JP-A-2012-208449 illustrates a configuration where the channel part 308 of the transistor is surrounded from four directions in a plan view by an insulation unit 611 disposed on a light incident side of a layer where the channel part is disposed; however, such a configuration cannot sufficiently prevent the light advancing toward the semiconductor layer from entering from a length direction of the semiconductor layer of the transistor, a direction inclined diagonally relative to the length direction, a width direction, and a direction diagonally inclined diagonally relative to the width direction, and thus, it is difficult to sufficiently prevent occurrence of an optical leakage current.

In view of the above problems, an object of the present disclosure is to provide an electro-optical device capable of effectively preventing light from entering a semiconductor layer of a transistor, an electronic apparatus, and a manufacturing method of the electro-optical device.

SUMMARY

To resolve the above problems, one aspect of an electro-optical device according to the present disclosure includes a substrate, a pixel electrode provided at one surface side of the substrate, a first light-shielding layer provided between the substrate and the pixel electrode and extending along an edge of the pixel electrode in a plan view, a transistor extending between the substrate and the first light-shielding layer and including a semiconductor layer overlapping with the first light-shielding layer in a plan view, a second light-shielding layer provided between the substrate and the semiconductor layer and overlapping with the semiconductor layer in a plan view, an insulating layer provided between the substrate and the pixel electrode, and a cavity provided at both sides of the semiconductor layer in a width direction and at both sides of the semiconductor layer in a length direction, in a plan view. According to an aspect of the present disclosure, a "plan view" refers to a state of being viewed in a thickness direction being a direction perpendicular to the substrate.

In the present disclosure, the semiconductor layer overlaps with the first light-shielding layer and the semiconductor layer in a plan view, and thus, it is possible to shield light moving from the pixel electrode side and the substrate side toward the semiconductor layer by the first light-shielding layer and the second light-shielding layer. Further, inside the insulating layer, the cavity is provided at both sides in the width direction of the semiconductor layer and at both sides in the length direction of the semiconductor layer. Thus, light attempting to enter the semiconductor layer from the width direction of the semiconductor layer can be shielded by utilizing reflection at a boundary surface between the cavity and the insulating layer, and light advancing toward the semiconductor layer from the length direction of the semiconductor layer or a direction diagonally inclined relative to the length direction can be shielded by reflection at a boundary surface between the cavity and the insulating layer. Therefore, it is possible to more effectively prevent light entering the semiconductor layer, which more effectively inhibits occurrence of optical leakage current in the transistor.

According to an aspect of the present disclosure, an aspect may be employed in which the cavity surrounds the semiconductor layer in a plan view. According to such an aspect, it is possible to more effectively prevent light from entering the semiconductor layer.

According to an aspect of the present disclosure, an aspect may be employed in which the inside of the cavity is vacuum. According to such an aspect, the cavity is blocked by utilizing a semiconductor process in a vacuum, and thus, as compared with a case where the inside of the cavity is an air space, the cavity can be formed more easily. According to an aspect of the present disclosure, "vacuum" means a space state where a pressure is lower than an atmospheric pressure.

According to an aspect of the present disclosure, an aspect may be employed in which the cavity is provided from a position on the substrate side relative to the semiconductor layer to a position on the pixel electrode side relative to the semiconductor layer, in a thickness direction being a direction perpendicular to the substrate. According to such an aspect, it is possible to more effectively prevent light from entering the semiconductor layer. In such a case, an aspect may be employed where the semiconductor layer is positioned behind at least one of the light-shielding layer and the cavity when viewed from any direction from the substrate side. According to such an aspect, even when an optical feedback formed as a result of light output from the electro-optical device entering again the electro-optical device after being reflected by an optical element and the like advances from the substrate side to the semiconductor layer, the light can be more effectively shielded by the reflection at the boundary surface between the cavity and the insulating layer and by the light-shielding layer.

According to an aspect of the present disclosure, an aspect may be adopted in which the cavity is provided up to a position on the pixel electrode side relative to a gate electrode provided on the pixel electrode side relative to the semiconductor layer of the transistor in the thickness direction, and the gate electrode is electrically coupled with a scan line formed as any one of the first light-shielding layer and the second light-shielding layer, from the pixel electrode side relative to the cavity. According to such an aspect, even when light attempts to advance toward the semiconductor layer from the pixel electrode side, the light can be efficiently shielded by the reflection at the boundary surface between the cavity and the insulating layer. In this case, in a case where the gate electrode itself is a part of the scan line, the scan line is broken by the cavity, but in a case where an aspect in which the scan line provided separately of the gate electrode is electrically coupled to the gate electrode from the pixel electrode side relative to the cavity is employed, it is possible to avoid the scan line from being broken by the cavity.

According to an aspect of the present disclosure, an aspect may be adopted in which a first end being an end of the cavity on the pixel electrode side includes a first bent portion bent toward an inside where the semiconductor layer is positioned in a plan view. According to such an aspect, even when light attempts to advance toward the semiconductor layer from the pixel electrode side, the light can be shielded by the reflection at the boundary surface between the first bent portion of the cavity and the insulating layer.

According to an aspect of the present disclosure, an aspect may be adopted in which a second end being an end of the cavity on the substrate side includes a second bent portion bent toward an outside being opposite to where the semiconductor layer is positioned in a plan view. According to such an aspect, even when an optical feedback formed as a result of light output from the electro-optical device entering again the electro-optical device after being reflected by an optical element and the like advances from the substrate side toward the semiconductor layer, the light can be shielded by reflection at the boundary surface between the second bent unit of the cavity and the insulating layer and by the light-shielding layer.

According to an aspect of the present disclosure, an aspect may be adopted in which the insulating layer includes an outer wall formation film provided to cover the semiconductor layer and constituting a wall surface of the cavity opposite to the semiconductor layer, and the outer wall formation film is provided with an opening portion communicating with the cavity at a portion overlapping with the semiconductor layer on the pixel electrode.

According to an aspect of the present disclosure, an aspect may be adopted in which the insulating layer includes an inner wall formation film provided to cover the semiconductor layer and constituting a wall surface of the cavity on the semiconductor layer side.

Another aspect of an electro-optical device according to the present disclosure includes a substrate, a pixel electrode provided at one surface side of the substrate, a first light-shielding layer provided between the substrate and the pixel electrode and extending along an edge of the pixel electrode in a plan view, a transistor extending between the substrate and the first light-shielding layer and including a semiconductor layer overlapping with the first light-shielding layer in a plan view, a second light-shielding layer provided between the substrate and the semiconductor layer and overlapping with the semiconductor layer in a plan view, and an insulating layer provided between the substrate and the pixel electrode. In a plan view, the semiconductor layer and the insulating layer are separated at both sides of the semiconductor layer in a width direction and at both sides of the semiconductor layer in a length direction.

In the present disclosure, the semiconductor layer overlaps with the first light-shielding layer and the semiconductor layer in a plan view, and thus, it is possible to shield light moving from the pixel electrode side and the substrate side toward the semiconductor layer by the first light-shielding layer and the second light-shielding layer. Further, in a plan view, the semiconductor layer and the insulating layer are separated at both sides of the semiconductor layer in a width direction and at both sides of the semiconductor layer in a length direction. Thus, light attempting to enter the semiconductor layer from the width direction of the semiconductor layer can be shielded by utilizing reflection at a boundary surface of the insulating layer, and light advancing toward the semiconductor layer from the length direction of the semiconductor layer or a direction diagonally inclined relative to the length direction can be shielded by reflection at a boundary surface of the insulating layer. Therefore, it is possible to more effectively prevent light entering the semiconductor layer, which more effectively inhibits occurrence of optical leakage current in the transistor.

The electro-optical device to which the present disclosure is applied is used for a variety of electronic apparatuses. In the present disclosure, when the electronic apparatus is a projection-type display apparatus, the projection-type display apparatus is provided with a light source unit configured to emit a light to be applied to the electro-optical device, and a projection optical system configured to project light modulated by the electro-optical device.

The present disclosure is a method of manufacturing an electro-optical device including a substrate, a pixel electrode provided at one surface side of the substrate, a first light-shielding layer provided between the substrate and the pixel electrode and extending along an edge of the pixel electrode in a plan view, a transistor extending between the substrate and the first light-shielding layer and including a semiconductor layer overlapping with the first light-shielding layer in a plan view, a second light-shielding layer provided between the substrate and the semiconductor layer and overlapping with the semiconductor layer in a plan view, and an insulating layer provided between the substrate and the pixel electrode, the method including after forming the first light-shielding layer, the semiconductor layer, and a part of the insulating layer at one surface side of the substrate, a first step of etching the part of the insulating layer to form a wall surface to cover a surrounding of the semiconductor layer and a side of the pixel electrode of the semiconductor layer, a second step of forming a sacrifice film to cover the wall surface, a third step of forming another part different from the part of the insulating layer to cover the sacrifice film, a fourth step of forming an opening portion in a portion overlapping with the sacrifice film of the other part in the plan view, and a fifth step of removing the sacrifice film from the opening portion to form a cavity at both sides of the semiconductor layer in a width direction and at both sides of the semiconductor layer in a length direction in a plan view.

In the present disclosure, after the sacrifice film is formed on the wall surface formed in the insulating film to cover the surrounding of the semiconductor layer and the side of the pixel electrode of the semiconductor layer, the other insulating film covering the sacrifice film is formed, and the sacrifice film is removed by etching from the opening portion to form the cavity. Therefore, the cavity can be easily formed at both sides in the width direction of the semiconductor layer and at both sides in the length direction of the semiconductor layer in a plan view. Accordingly, light attempting to enter the semiconductor layer from the width direction of the semiconductor layer can be shielded by utilizing reflection at a boundary surface between the cavity and the insulating layer, and light advancing toward the semiconductor layer from the length direction of the semiconductor layer or a direction diagonally inclined relative to the length direction can be shielded by reflection at a boundary surface between the cavity and the insulating layer. This further prevents light from entering the semiconductor layer, which further inhibits occurrence of optical leakage current in the transistor.

BRIEF DESCRIPTION OF THE DRAWINGS

FIG. 6 is a plan view illustrating a light-shielding structure of a semiconductor layer illustrated in FIG. 4 and the like.

DESCRIPTION OF EXEMPLARY EMBODIMENTS

Figure 1:
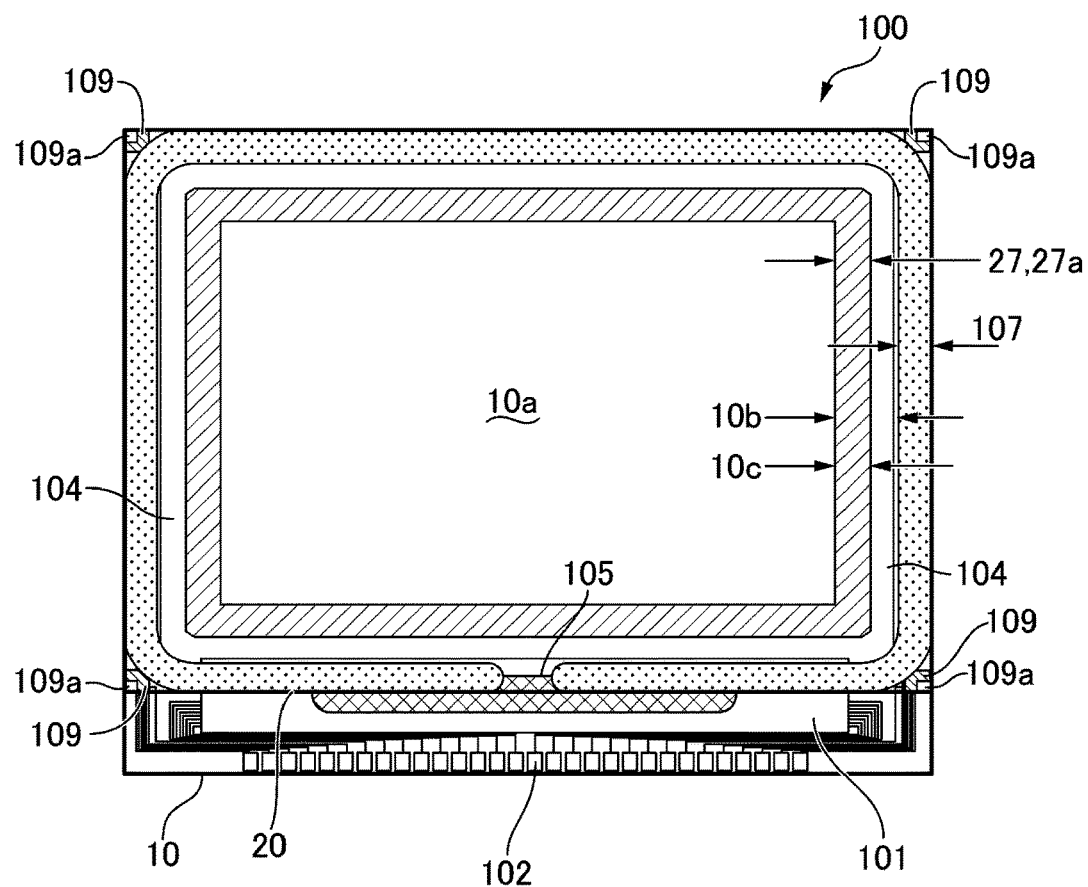
FIG. 1 is a plan view of an electro-optical device to which the present disclosure is applied.

Embodiments of the present disclosure will be described below with reference to the drawings. Note that, in each of the figures to be referred to in the following description, to illustrate each layer, each member, and the like in a recognizable size in the drawings, each layer, each member, and the like are illustrated at a different scale. Further, in the following description, when description is made of various layers formed on a first substrate 10, an upper layer side or a surface side refers to a side (side on which a second substrate 20 is positioned) opposite to a side on which the first substrate 10 is positioned, and a lower layer side refers to the side on which the first substrate 10 is positioned.

Configuration of Electro-optical Device

Figure 2:
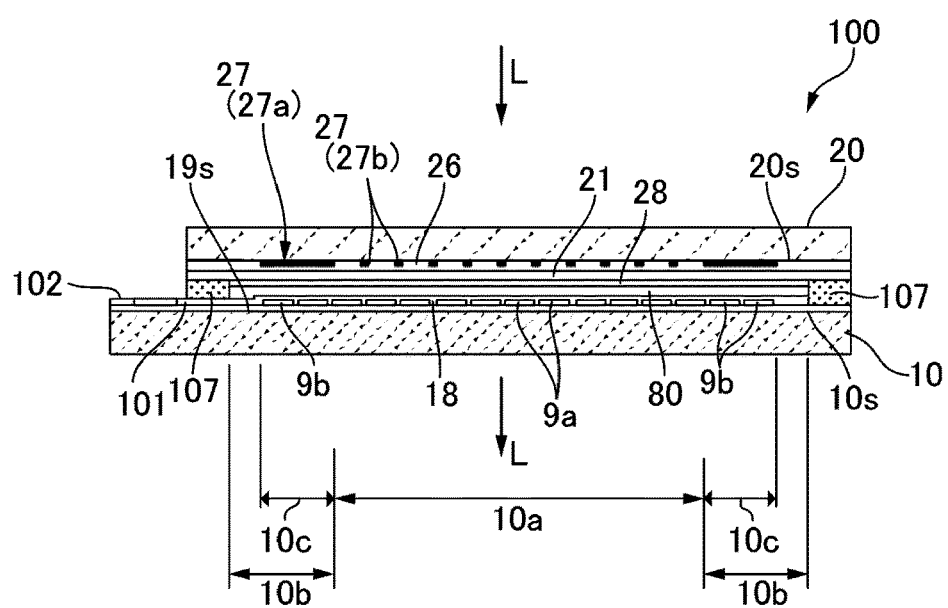
FIG. 2 is a cross-sectional view of the electro-optical device illustrated in FIG. 1.

FIG. 1 is a plan view of an electro-optical device 100 to which the present disclosure is applied. FIG. 2 is a cross-sectional view illustrating the electro-optical device 100 illustrated in FIG. 1. As illustrated in FIG. 1 and FIG. 2, in the electro-optical device 100, a first substrate 10 and a second substrate 20 are bonded together with a sealing material 107 creating a predetermined gap, where the first substrate 10 is opposed to the second substrate 20. The sealing material 107 is provided in a frame-like shape in conformance with the outer edge of the second substrate 20. An electro-optical layer 80 such as a liquid crystal layer is provided in an area surrounded by the sealing material 107 between the first substrate 10 and the second substrate 20. Accordingly, the electro-optical device 100 is constituted as a liquid crystal device. The sealing material 107 is a photocurable adhesive, or a photocurable and thermosetting adhesive, and a gap material such as glass fiber or glass beads for setting a distance between the substrates to a predetermined value is compounded in the seal material 107. The first substrate 10 and the second substrate 20 both have a quadrangle shape, and in a substantially central portion of the electro-optical device 100, a display region 10a is provided as a quadrangle region. In accordance with such a shape, the sealing material 107 is also provided in a substantially quadrangular shape, and a peripheral region 10b having a rectangular frame shape is provided between an inner peripheral edge of the seal material 107 and an outer peripheral edge of the display region 10a.

The first substrate 10 is a transmissive substrate such as a quartz substrate and a glass substrate. On the one side 10s of the first substrate 10 closer to the second substrate 20 and outside of the display region 10a, a data line driving circuit 101 and a plurality of terminals 102 are formed along one of the sides of the first substrate 10, and a scanning line drive circuit 104 is formed along another one of the sides adjacent to the one side. A flexible wiring substrate (not illustrated) is coupled to the terminals 102, and various potentials and various signals are input to the first substrate 10 via the flexible wiring substrate.

On the one side 10s of the first substrate 10, in the display region 10a, a plurality of transmissive pixel electrodes 9a formed of an Indium Tin Oxide (ITO) film and the like, and transistors (not illustrated in FIG. 2) electrically coupled to each of the plurality of pixel electrodes 9a are formed in a matrix shape. A first orientation film 18 is formed on the second substrate 20 side with respect to the pixel electrodes 9a, and the pixel electrodes 9a are covered with the first orientation film 18.

The second substrate 20 includes a transmissive substrate such as a quartz substrate or a glass substrate. A transmissive common electrode 21 including an ITO film and the like is formed at one side surface 20s side facing the first substrate 10 in the second substrate 20, and a second orientation film 28 is formed on the first substrate 10 side with respect to the common electrode 21. The common electrode 21 is formed over substantially the entire surface of the second substrate 20, and is covered with the second orientation film 28. A light-shielding layer 27 having light-shielding properties and being formed of a resin, a metal, or a metal compound is formed between the one side surface 20s of the second substrate 20 and the common electrode 21, and a transmissive protective layer 26 is formed between the light-shielding layer 27 and the common electrode 21. The light-shielding layer 27 is formed, for example, as a parting edge 27a in a frame-like shape extending along the outer peripheral edge of the display region 10a. The light-shielding layer 27 is also formed as a light-shielding layer 27b (a black matrix) in a region overlapping in a plan view with a region located between the adjacent pixel electrodes 9a. In the peripheral region 10b of the first substrate 10, a dummy pixel region 9b, which is concurrently formed with the pixel electrodes 9a, is formed in the dummy pixel area 10c that overlaps in a plan view with the parting edge 27a.

The first orientation film 18 and the second orientation film 28 are inorganic alignment films (vertical alignment films) including obliquely vapor-deposited film of $SiO_x$ (x<2), $SiO_2$, $TiO_2$, MgO, $Al_2O_3$, and the like, where liquid crystal molecules having negative dielectric anisotropy used for the electro-optical layer 80 are tilt-oriented. Therefore, the liquid crystal molecules form a predetermined angle with respect to the first substrate 10 and the second substrate 20. In this way, the electro-optical device 100 is constituted as a liquid crystal device of a Vertical Alignment (VA) mode.

The first substrate 10 includes inter-substrate conduction electrodes 109 being formed in regions positioning outside the sealing material 107 and overlapping with corner portions of the second substrate 20, so that electrical conduction is established between the first substrate 10 and the second substrate 20. Inter-substrate conduction materials 109a including conductive particles are arranged in the inter-substrate conduction electrodes 109. The common electrode 21 of the second substrate 20 is electrically coupled to the first substrate 10 side via the inter-substrate conduction materials 109a and the inter-substrate conduction electrodes 109. Therefore, a common potential is applied to the common electrode 21 from the first substrate 10 side.

In the electro-optical device 100, the pixel electrodes 9a and the common electrode 21 are formed of transmissive electrically conducting film such as an ITO film, and the electro-optical device 100 is constituted as a transmission-type liquid crystal device. In the electro-optical device 100, of the first substrate 10 and the second substrate 20, light that is incident to the electro-optical layer 80 from either one of the substrates is modulated while passing through the other substrate and being emitted, and displays an image. In the present embodiment, the electro-optical device 100 displays an image by the light incident from the second substrate 20 being modulated by the electro-optical layer 80 for each of the pixels while passing through the first substrate 10 and being emitted, as indicated by an arrow L.

Specific Configuration of Pixel

Figure 3:
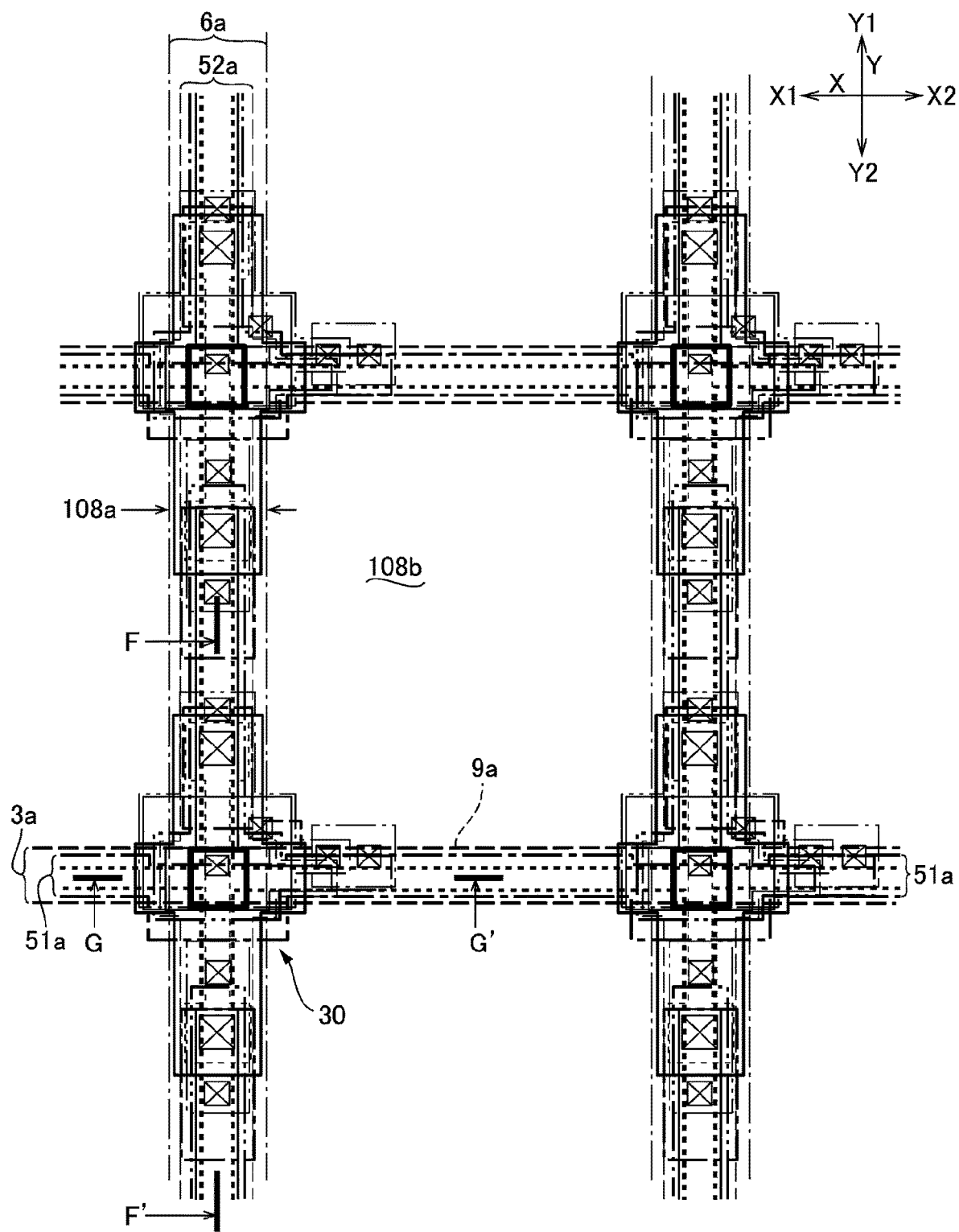
FIG. 3 is a plan view of a plurality of pixels adjacent to one another in the electro-optical device illustrated in FIG. 1.
Figure 4:
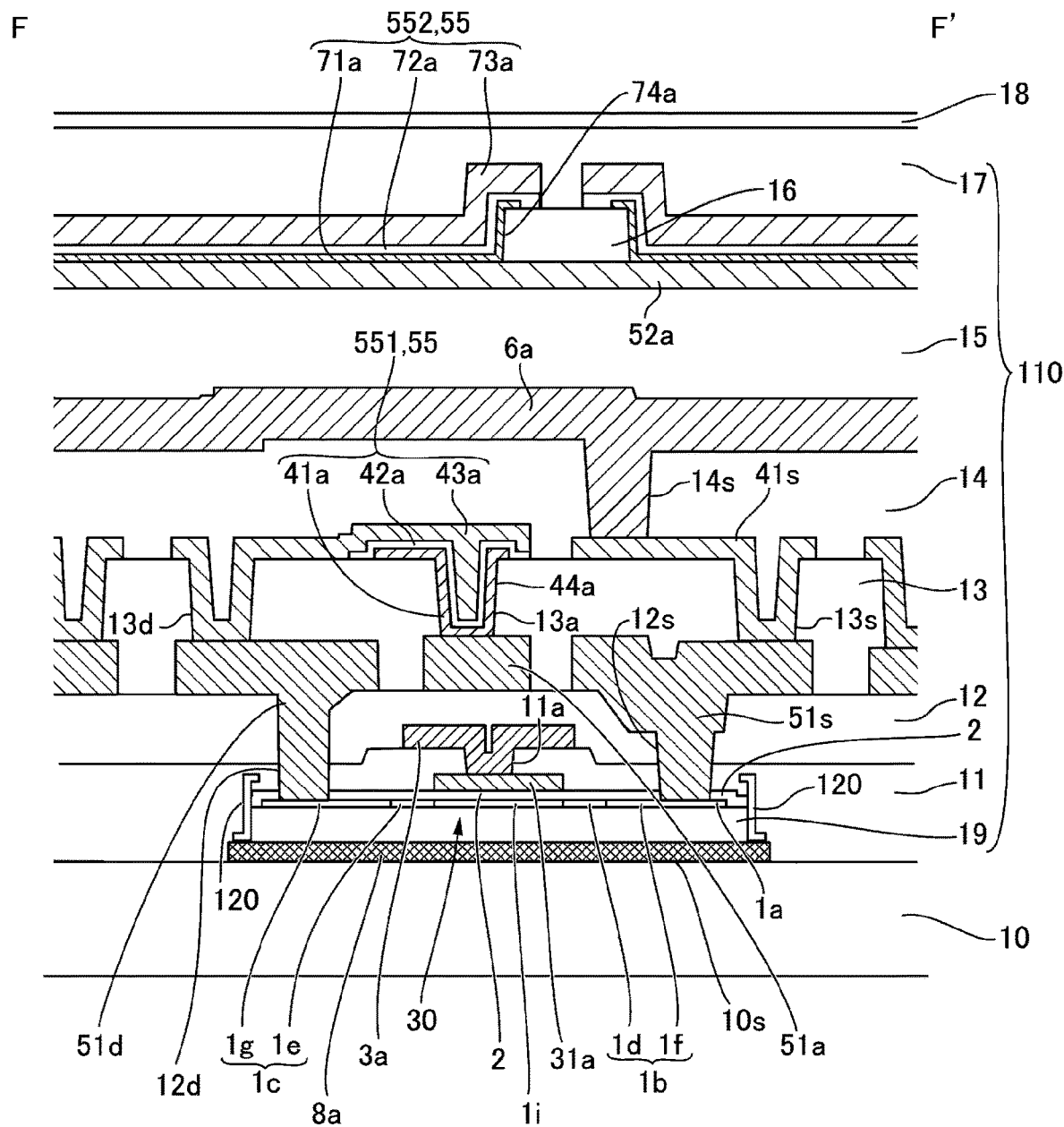
FIG. 4 is a cross-sectional view taken along F-F' of the electro-optical device illustrated in FIG. 3.
Figure 5:
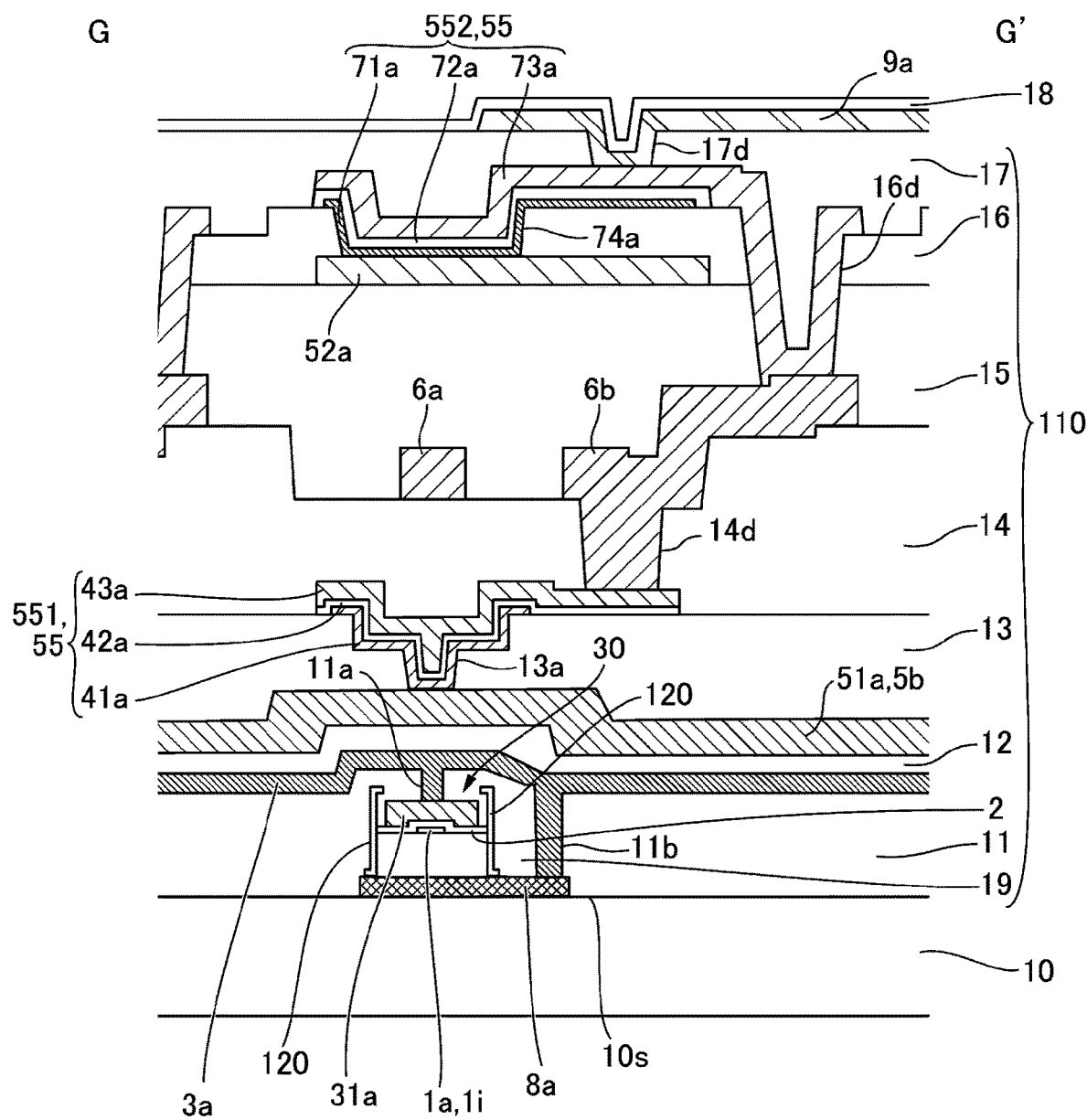
FIG. 5 is a cross-sectional view take along G-G' of the electro-optical device illustrated in FIG. 3.

FIG. 3 is a plan view of the plurality of pixels adjacent to each other in the electro-optical device 100 illustrated in FIG. 1. FIG. 4 is a cross-sectional view taken along F-F' of the electro-optical device 100 illustrated in FIG. 3, and is a cross-sectional view taken along the data line 6a. FIG. 5 is a cross-sectional view taken along G-G' of the electro-optical device 100 illustrated in FIG. 3, and is a cross-sectional view taken along the scan line 3a. Note that FIG. 5 illustrates a state obtained when cutting at a position passing through a contact hole 17d with respect to the pixel electrodes 9a.

As illustrated in FIG. 3, the pixel electrodes 9a are formed on each of the plurality of pixels on a surface facing the second substrate 20 in the first substrate 10, and the data line 6a, the scan line 3a, a first capacitor line 51a, a second capacitor line 52a, and the like are provided to extend along the end of the pixel electrodes 9a. For example, the scan line 3a extends in the first direction X in the inter-pixel region. The data line 6a extends in the second direction Y in the inter-pixel region. The transistor 30 is formed corresponding to the intersection between the data line 6a and the scan line 3a. The first capacitor line 51a extends in the first direction X so as to overlap with the scan line 3a in a plan view, and the second capacitor line 52a extends in the second direction Y so as to overlap with the data line 6a in a plan view.

The scan line 3a, the data line 6a, the first capacitor line 51a, and the second capacitor line 52a are light-shielding wirings formed of materials having a light shielding property, and a plurality of light-shielding layers are constituted of such light-shielding wirings. Thus, the region in which the scan line 3a, the data line 6a, the first capacitor line 51a and the second capacitor line 52a are formed is a light-shielding region 108a through which light does not pass. The region surrounded by the light-shielding region 108a is an aperture region 108b through which light passes (a transmissive region).

As illustrated in FIG. 4 and FIG. 5, the electro-optical device 100 includes the first substrate 10, the pixel electrodes 9a provided at the one side 10s side of the first substrate 10, and a plurality of light-shielding layers extending along the edge of the pixel electrodes 9a as viewed in a plan view from the thickness direction perpendicular to the first substrate 10 between the first substrate 10 and the pixel electrodes 9a. In the present embodiment, the plurality of light-shielding layers include the scan line 3a, the data line 6a, the first capacitor line 51a, and the second capacitor line 52a.

The electro-optical device 100 includes a transistor 30 extending between the first substrate 10 and the plurality of light-shielding layers and including a semiconductor layer 1a overlapping with at least one first light-shielding layer, out of the plurality of light-shielding layers, in a plan view, a second light-shielding layer 8a overlapping with the semiconductor layer 1a in a plan view between the first substrate 10 and the semiconductor layer 1a, and an insulating layer 110 including a plurality of interlayer insulating films provided between the first substrate 10 and the pixel electrodes 9a. The semiconductor layer 1a and the first light-shielding layer are formed between each layer of the plurality of interlayer insulating films.

The transistor 30 is a thin-film transistor, and includes the semiconductor layer 1a provided between the first substrate 10 and the pixel electrodes 9a, a gate electrode 31a provided a side of the pixel electrodes 9a relative to the semiconductor layer 1a, a source electrode 51s provided between the pixel electrodes 9a and the semiconductor layer 1a, and a drain electrode 51d provided between the pixel electrodes 9a and the semiconductor layer 1a.

As described below, the insulating layer 110 includes a gate insulating layer 2, a first dielectric layer 42a, and a second dielectric layer 72a, in addition to the plurality of interlayer insulating films. Firstly, an interlayer insulating film 19 is formed between the second light-shielding layer 8a and the semiconductor layer 1a, and an interlayer insulating film 11 is formed between the gate electrode 31a and the scan line 3a. An interlayer insulating film 12 is formed between the scan line 3a and the first capacitor line 51a, and an interlayer insulating film 13 is formed between the first capacitor line 51a and a first capacitor electrode 41a. An interlayer insulating film 14 is formed between a second capacitor electrode 43a and the data line 6a, and an interlayer insulating film 15 is formed between the data line 6a and the second capacitor line 52a. An interlayer insulating film 16 is formed between the second capacitor line 52a and a third capacitor electrode 71a, and an interlayer insulating film 17 is formed between a fourth capacitor electrode 73a and the pixel electrodes 9a. Any one of the interlayer insulating films 19, and 11 to 17 is a transmissive insulating film formed of a silicon oxide film and the like.

Detailed Configuration of Pixel

The second light-shielding layer 8a is formed on the one side 10s of the first substrate 10, and the second light-shielding layer 8a includes an electrically conducting film having a light shielding property such as a metal silicide film, a metal film, and a metal compound film. The semiconductor layer 1a of the transistor 30 is formed on the surface of the interlayer insulating film 11 on the pixel electrode 9a side, and the semiconductor layer 1a is covered with the gate insulating layer 2 from the pixel electrode 9a side. The semiconductor layer 1a includes a polysilicon film (polycrystalline silicon film) or the like, and extends along the data line 6a. The gate insulating layer 2 has a two-layer structure including a first gate insulating layer including a silicon oxide film that is obtained by thermally oxidizing the semiconductor layer 1a, and a second gate insulating layer including a silicon oxide film that is formed by the low-pressure CVD method and the like.

The gate electrode 31a is formed on the surface of the gate insulating layer 2 on the pixel electrode 9a side. The scan line 3a extends in the first direction X between the interlayer insulating film 11 and the interlayer insulating film 12, and is electrically coupled to the gate electrode 31a via the contact hole 11a of the interlayer insulating film 11. In the interlayer insulating film 19 and the interlayer insulating film 11, contact holes 11b electrically coupling the scan line 3a and the second light-shielding layer 8a are formed. Therefore, the second light-shielding layer 8a functions as a back gate.

The gate electrode 31a overlaps with a central section in the lengthwise direction of the semiconductor layer 1a. The semiconductor layer 1a is provided with a channel region 1i that faces the gate electrode 31a via the gate insulating layer 2, and the channel region 1i is provided on both sides with a source region 1b and a drain region 1c. The transistor 30 has an LDD structure. Thus, the source region 1b and the drain region 1c respectively have low concentration regions 1d and 1e at both sides of the channel region 1i, and respectively have high concentration regions 1f and 1g in regions adjacent to the low concentration regions 1d and 1e on the opposite side to the channel region 1i. The gate electrode 31a is formed of an electrically conducting film having a light shielding property such as a conductive polysilicon film, a metal silicide film, a metal film, and a metal compound film, for example. The scan line 3a is formed of an electrically conducting film having a light shielding property such as a metal silicide film, a metal film, and a metal compound film. In the present embodiment, the gate electrode 31a and the scan line 3a include, for example, a multilayer structure of Ti (titanium) layer/TiN (titanium nitride) layer/Al (aluminum) layer/TiN (titanium nitride) layer or a multilayer structure of TiN layer/Al layer/TiN layer.

The first capacitor line 51a, which has light-shielding properties and overlaps with the gate electrode 31a in a plan view, is formed on the surface of the interlayer insulating film 12 on the pixel electrode 9a side. The common potential is applied to the first capacitor line 51a. The first capacitor line 51a extends in the first direction X, and overlaps with the scan line 3a in a plan view. The source electrode 51s and the drain electrode 51d are formed in positions separated from the first capacitor line 51a in the second direction Y, on the surface of the interlayer insulating film 12 on the pixel electrode 9a side. The source electrode 51s and the drain electrode 51d are configured by the same electrically conducting layer as the first capacitor line 51a. The source electrode 51s and the drain electrode 51d are each electrically coupled to a source region 1b and a drain region 1c via contact holes 12s and 12d that penetrate the interlayer insulating film 12. The first capacitor line 51a, the source electrode 51s, and the drain electrode 51d are formed of an electrically conducting film having a light shielding property such as a metal silicide film, a metal film, and a metal compound film. In the present embodiment, the first capacitor line 51a, the source electrode 51s, and the drain electrode 51d includes, for example, a multilayer structure of Ti (titanium) layer/TiN (titanium nitride) layer/Al (aluminum) layer/TiN (titanium nitride) layer or a multilayer structure of TiN layer/Al layer/TiN layer.

A first concave portion 44a overlapping with the first capacitor line 51a in a plan view, is formed in the interlayer insulating film 13. Further, the first capacitor electrode 41a, which extends from a bottom portion of the first concave portion 44a to the surface of the interlayer insulating film 13 on the pixel electrode 9a side and which has light-shielding properties, and the second capacitor electrode 43a, which overlaps with the first capacitor electrode 41a from the pixel electrode 9a side and which has light-shielding properties, are formed in a region overlapping with the first concave portion 44a. Here, the second capacitor electrode 43a is electrically coupled to the drain electrode 51d and the pixel electrodes 9a. The first capacitor electrode 41a and the second capacitor electrode 43a are formed of an electrically conducting film such as an electrically conducting polysilicon film, a metal silicide film, a metal film, a metal compound film, and the like. In the present embodiment, the first capacitor electrode 41a and the second capacitor electrode 43a include TiN (titanium nitride) film and the like.

The first capacitor electrode 41a is electrically coupled to the first capacitor line 51a at the bottom portion of the first concave portion 44a. More specifically, a contact hole 13a that penetrates the interlayer insulating film 13 is formed at the bottom portion of the first concave portion 44a, and the first capacitor electrode 41a is electrically coupled to the first capacitor line 51a via the contact hole 13a. The first dielectric layer 42a is formed between the first capacitor electrode 41a and the second capacitor electrode 43a, and a first holding capacitor 551 of the holding capacitor 55 is configured by the first capacitor electrode 41a, the first dielectric layer 42a, and the second capacitor electrode 43a.

A relay electrode 41s is formed in a position separated from the first capacitor electrode 41a, on the surface of the interlayer insulating film 13 on the pixel electrode 9a side, so as to overlap with the source electrode 51s in a plan view. The relay electrode 41s is configured by the same electrically conducting layer as the first capacitor electrode 41a. The relay electrode 41s is electrically coupled to the source electrode 51s via a contact hole 13s that penetrates the interlayer insulating film 13. The second capacitor electrode 43a is electrically coupled to the drain electrode 51d via a contact hole 13d that penetrates the interlayer insulating film 13.

The data line 6a having light-shielding properties is formed so as to extend in the second direction Y on the surface of the interlayer insulating film 14 on the pixel electrode 9a side. The data line 6a is electrically coupled to the relay electrode 41s via a contact hole 14s that penetrates the interlayer insulating film 14. Thus, the data line 6a is electrically coupled to the source region 1b via the relay electrode 41s and the source electrode 51s. The data line 6a is formed of an electrically conducting film having a light shielding property such as a metal silicide film, a metal film, and a metal compound film. In the present embodiment, the data line 6a includes, for example, a multilayer structure of Ti (titanium) layer/TiN (titanium nitride) layer/Al (aluminum) layer/TiN (titanium nitride) layer or a multilayer structure of TiN layer/Al layer/TiN layer.

A relay electrode 6b is formed in a position separated from the data line 6a, so as to overlap with the second capacitor electrode 43a in a plan view. The relay electrode 6b is electrically coupled to the second capacitor electrode 43a via a contact hole 14d that penetrates the interlayer insulating film 14. The relay electrode 6b is configured by the same electrically conducting layer as the data line 6a.

The second capacitor line 52a, which has light-shielding properties and extends in the second direction Y so as to overlap with the data line 6a in a plan view, is formed on the surface of the interlayer insulating film 15 on the pixel electrode 9a side. The common potential is applied to the second capacitor line 52a. A second concave portion 74a, which is formed by a through hole that overlaps with the second capacitor line 52a in a plan view, is formed in the interlayer insulating film 16. The third capacitor electrode 71a, which extends from a bottom portion of the second concave portion 74a to the surface of the interlayer insulating film 16 on the pixel electrode 9a side and which has light-shielding properties, and the fourth capacitor electrode 73a, which overlaps with the third capacitor electrode 71a from the pixel electrode 9a side and which has light shielding properties, are formed in a region overlapping with the second concave portion 74a.

The fourth capacitor electrode 73a is electrically coupled to the drain electrode 51d and the pixel electrodes 9a. More specifically, the fourth capacitor electrode 73a is electrically coupled to the relay electrode 6b via a contact hole 16d that penetrates the interlayer insulating films 15 and 16. The second capacitor line 52a includes an electrically conducting film having a light shielding property such as a metal silicide film, a metal film, or a metal compound film. In the embodiment, the second capacitor line 52a, the source electrode 51s, and the drain electrode 51d include, for example, a multilayer structure of Ti (titanium) layer/TiN (titanium nitride) layer/Al (aluminum) layer/TiN (titanium nitride) layer or a multilayer structure of TiN layer/Al layer/TiN layer.

The third capacitor electrode 71a is electrically coupled to the second capacitor line 52a at the bottom portion of the second concave portion 74a. The second dielectric layer 72a is formed between the third capacitor electrode 71a and the fourth capacitor electrode 73a, and a second holding capacitor 552 of the holding capacitor 55 is configured by the third capacitor electrode 71a, the second dielectric layer 72a, and the fourth capacitor electrode 73a. The third capacitor electrode 71a and the fourth capacitor electrode 73a are formed of an electrically conducting film such as an electrically conducting polysilicon film, a metal silicide film, a metal film, and a metal compound film.

The pixel electrode 9a is formed on the surface of the interlayer insulating film 17, which is opposed to the first substrate 10. The pixel electrode 9a is electrically coupled to the fourth capacitor electrode 73a via the contact hole 17d that penetrates the interlayer insulating film 17. Thus, the pixel electrode 9a is electrically coupled to the drain region 1c via the fourth capacitor electrode 73a, the relay electrode 6b, the second capacitor electrode 43a, and the drain electrode 51d.

Light-shielding Structure for Semiconductor Layer 1a

Figure 6:
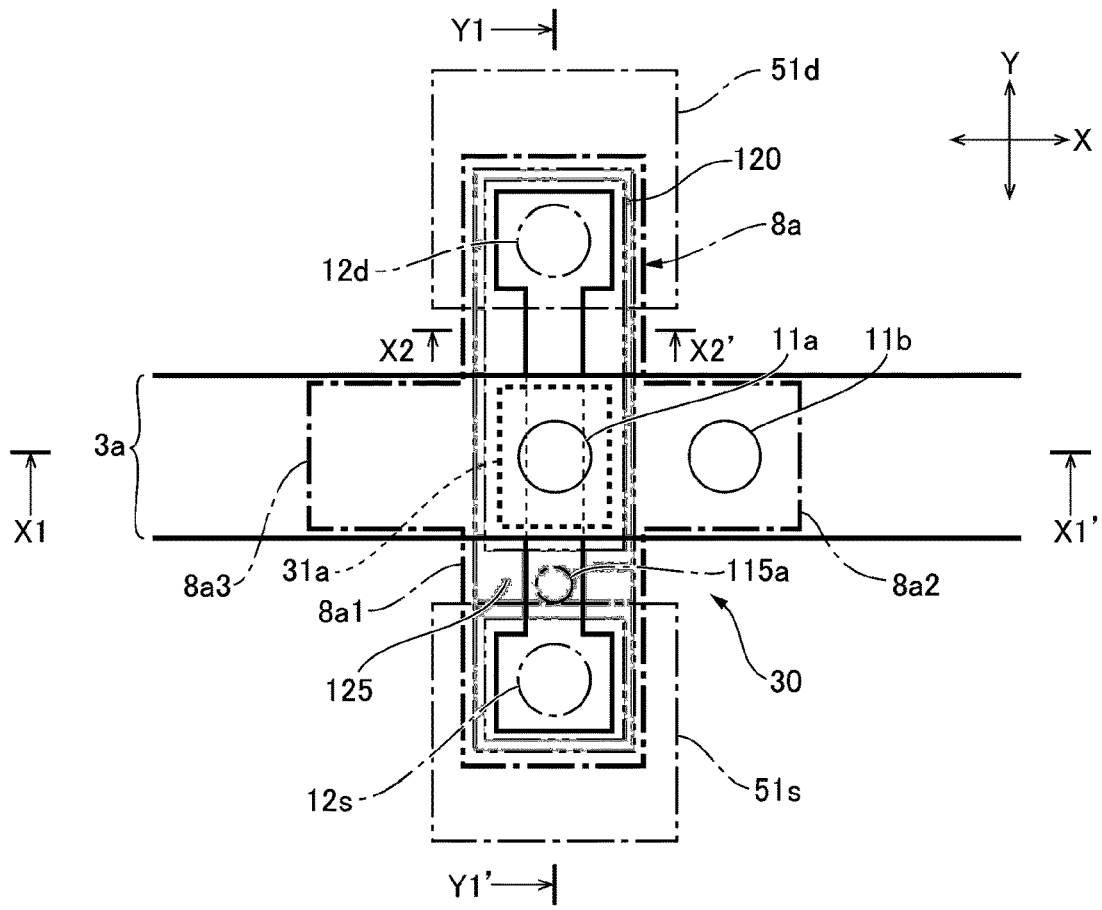
Figure 7:
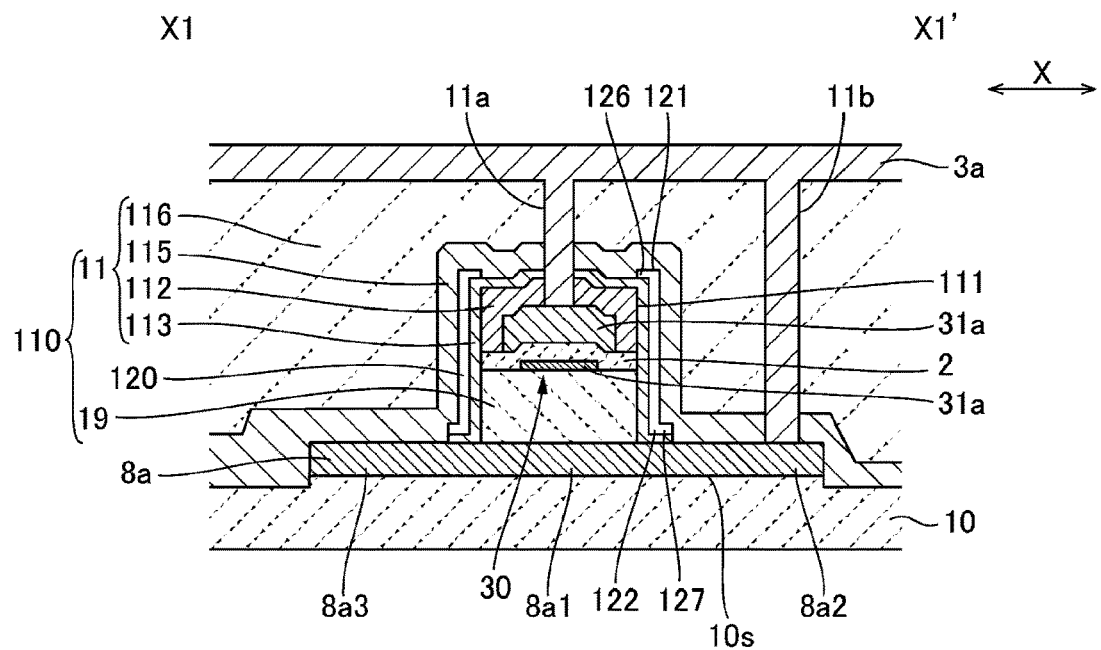
FIG. 7 is a cross-sectional view taken along X1-X1' obtained when the light-shielding structure illustrated in FIG. 6 is cut in a width direction of the semiconductor layer.
Figure 8:
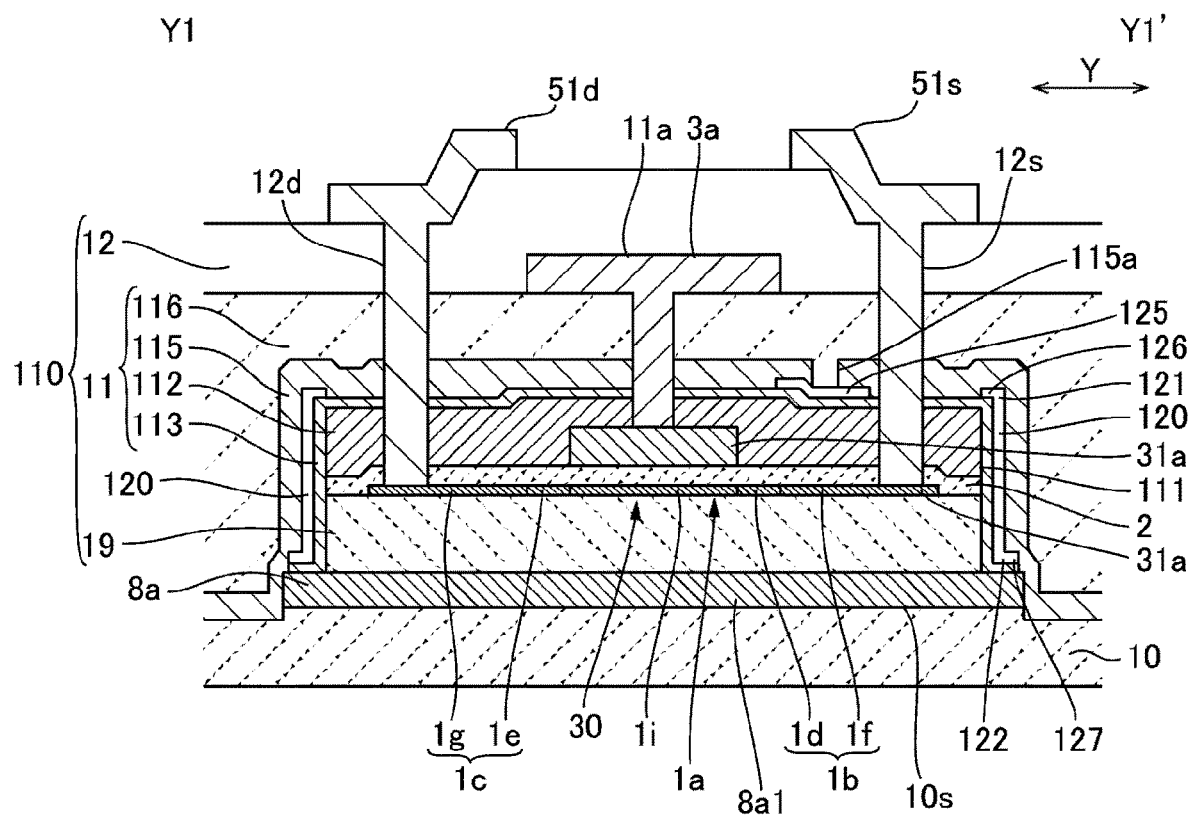
FIG. 8 is a cross-sectional view taken along Yl-Yl' obtained when the light-shielding structure illustrated in FIG. 6 is cut in a length direction of the semiconductor layer.

FIG. 6 is a plan view illustrating a light-shielding structure of the semiconductor layer 1a illustrated in FIG. 4 and the like. FIG. 7 is a cross-sectional view taken along X1-X1' obtained when the light-shielding structure illustrated in FIG. 6 is cut in the width direction of the semiconductor layer 1a. FIG. 8 is a cross-sectional view taken along Y1-Y1' obtained when the light-shielding structure illustrated in FIG. 6 is cut in the length direction of the semiconductor layer 1a.

As illustrated in FIG. 6, FIG. 7, and FIG. 8, the second light-shielding layer 8a includes a body portion 8a 1 extending in the length direction (Y direction) of the semiconductor layer 1a to overlap with the semiconductor layer 1a in a plan view, and convex portions 8a 2 and 8a 3 protruding toward the width direction (X direction) crossing the body portion 8a 1 from a certain position of the body portion 8a 1. The convex portions 8a2 and 8a3 overlap with the scan line 3a in a plan view. In the present embodiment, at a position overlapping with the convex portion 8a2 in a plan view, the contact hole 11b electrically coupling the second light-shielding layer 8a and the scan line 3a is formed.

On the one side 10s of the first substrate 10, inside the insulating layer 110, cavities 120 are provided which extend in the thickness direction at both sides in the width direction of the semiconductor layer 1a and at both sides in the length direction of the semiconductor layer 1a and surround the entire circumference of the semiconductor layer 1a in a plan view. Here, the cavities 120 are vacuum, and have a refractive index of 1. On the other hand, a refractive index of the silicon oxide film and the like constituting the insulating layer 110 is 1.46, for example. Therefore, a boundary surface between the cavities 120 and the insulating layer 110 constitute a reflection surface.

In forming such cavities 120, in the present embodiment, the interlayer insulating film 11 provided between the gate electrode 31a and the scan line 3a includes a first insulating film 112 and a second insulating film 116 formed on the pixel electrodes 9a side of the first insulating film 112. Out of the insulating layer 110, the interlayer insulating film 19, the gate insulating layer 2, and the first insulating film 112 are removed in the thickness direction at both sides in the width direction of the semiconductor layer 1a and at both sides in the length direction of the semiconductor layer 1a to form a wall surface 111 covering a surrounding of the semiconductor layer 1a and the semiconductor layer 1a on the pixel electrodes 9a side. More specifically, in the interlayer insulating film 19, the gate insulating layer 2, and the first insulating film 112, portions separated from the semiconductor layer 1a are removed, and only the area around the semiconductor layer 1a are retained to form the wall surface 111.

Therefore, inside the wall surface 111, the interlayer insulating film 19, the semiconductor layer 1a, the gate insulating layer 2, the gate electrode 31a, and the first insulating film 112 are layered, and the wall surface 111 covers the semiconductor layer 1a and the gate electrode 31a. In the present embodiment, the wall surface 111 is formed in a range overlapping with the second light-shielding layer 8a in a plan view, and the wall surface 111 is formed so that the end on the first substrate 10 side contacts the second light-shielding layer 8a.

Here, the insulating layer 110 includes an inner wall formation film 113 formed to cover the wall surface 111, and the inner wall formation film 113 covers the semiconductor layer 1a and the gate electrode 31a. Such an inner wall formation film 113 constitutes the wall surface of the cavities 120 on the semiconductor layer 1a side.

The insulating layer 110 includes an outer wall formation film 115 formed to cover the semiconductor layer 1a and the gate electrode 31a at the opposite side of the inner wall formation film 113 relative to the cavities 120, and the cavities 120 are provided between the inner wall formation film 113 and the outer wall formation film 115. Therefore, the outer wall formation film 115 constitutes a wall surface on the opposite side of the semiconductor layer 1a of the cavities 120.

The outer wall formation film 115 is provided with an opening portion 115a communicating to the cavities 120 at a portion overlapping on the pixel electrodes 9a relative to the semiconductor layer 1a, and in a state of the electro-optical device 100, the opening portion 115a is blocked by the second insulating film 116. The cavities 120 include a linkage portion 125 configured to communicate the cavities 120 positioned at both sides in the width direction of the semiconductor layer 1a through a portion where the opening portion 115a is formed, out of a region overlapping with the semiconductor layer 1a in a plan view, and a substantially entire region other than this is a region where the cavities 120 are not present. In the present embodiment, in the region where the cavities 120 are not present, the source electrode 51s and the drain electrode 51d are electrically coupled to the source region 1b and the drain region 1c of the semiconductor layer 1a via contact holes 12s and 12d.

In the present embodiment, the cavities 120 are provided from a position on the first substrate 10 side relative to the semiconductor layer 1a to a position on the pixel electrodes 9a side relative to the semiconductor layer 1a. More specifically, the cavities 120 are provided up to a position on the pixel electrode 9a side relative to the gate electrode 31a provided on the pixel electrode 9a side relative to the semiconductor layer 1a of the transistor 30, toward the pixel electrodes 9a, and the gate electrode 31a is electrically coupled with the scan line 3a formed as any one of the second light-shielding layer 8a and the first light-shielding layer from the pixel electrode 9a side relative to the cavities 120. In the present embodiment, the scan line 3a is formed on the surface of the interlayer insulating film 11 covering the gate electrode 31a on the pixel electrodes 9a side, and thus, the scan line 3a is electrically coupled to the gate electrode 31a via the contact hole 11a that penetrates the second insulating film 116, the outer wall formation film 115, the inner wall formation film 113, and the first insulating film 112.

Further, the cavities 120 extend to a position overlapping with the end of the second light-shielding layer 8a via the inner wall formation film 113 only, toward the first substrate 10. Thus, the semiconductor layer 1a is positioned behind at least one of the second light-shielding layer 8a and the cavities 120 when viewed from any direction on the first substrate 10 side.

In the present embodiment, a first end 121 being an end of the cavities 120 on the pixel electrodes 9a side includes a first bent portion 126 bent toward an inside being a side where the semiconductor layer 1a is positioned in a plan view. A second end 122 being an end of the cavities 120 on the first substrate 10 side includes a second bent unit 127 bent toward the outside being opposite to the side where the semiconductor layer 1a is positioned in a plan view.

Manufacturing Method for Electro-optical Device 100

Figure 9:
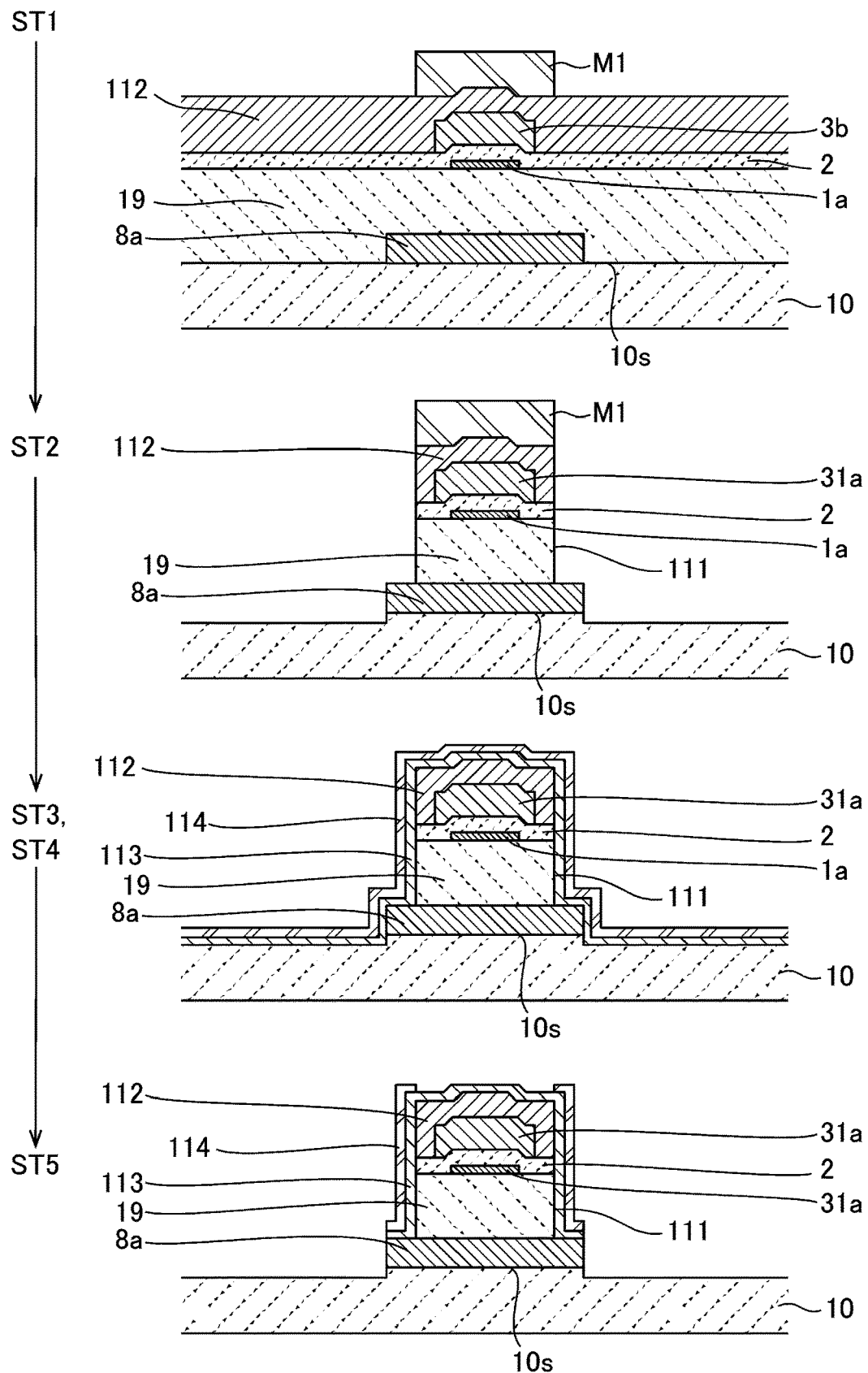
FIG. 9 is a cross-sectional view illustrating steps in a manufacturing method of the electro-optical device illustrated in FIG. 1.
Figure 10:
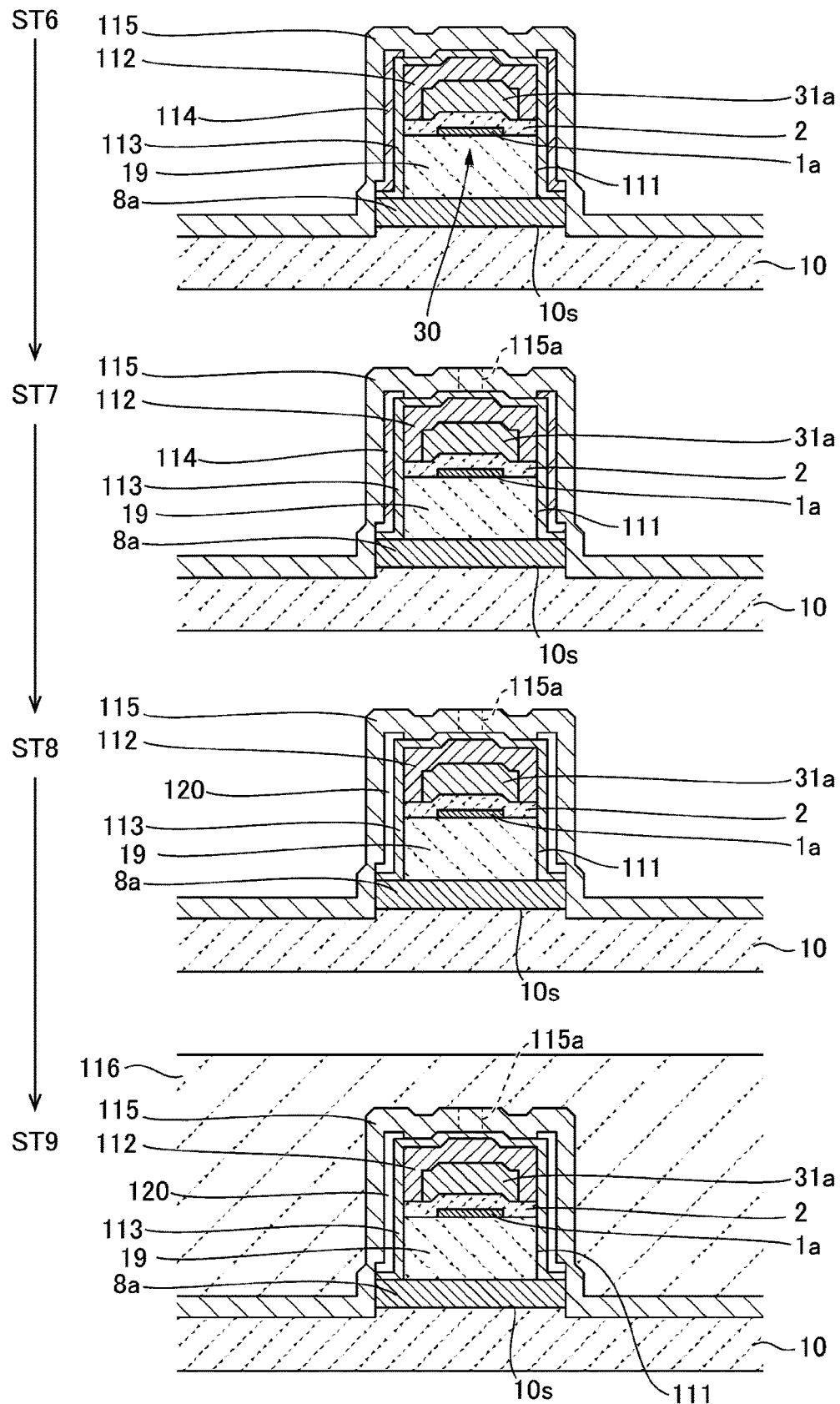
FIG. 10 is a cross-sectional view illustrating steps after the steps illustrated in FIG. 9.

FIG. 9 is a cross-sectional view illustrating steps in a manufacturing method of the electro-optical device 100 illustrated in FIG. 1, where steps until the inner wall formation film 113 is formed are illustrated. FIG. 10 is a cross-sectional view illustrating steps after the steps illustrated in FIG. 9, where steps until the second insulating film 116 is formed are illustrated. FIG. 9 and FIG. 10 correspond to a cross-sectional view taken along X2-X2' of FIG. 6.

Out of steps of manufacturing the electro-optical device 100 according to the present embodiment, a step of forming the cavities 120 is described below. Firstly, in step ST1 illustrated in FIG. 9, the second light-shielding layer 8a, the semiconductor layer 1a, and a part of the insulating layer 110 (the interlayer insulating film 19, the gate insulating layer 2, and the first insulating film 112) on the one side 10s side of the first substrate 10 is formed. Further, in the semiconductor layer 1a, impurities are injected into the source region 1b and the drain region 1c illustrated in FIG. 4.

In step ST2 illustrated in FIG. 9, while an etching mask Ml is formed on a surface of the first insulating film 112, the interlayer insulating film 19, the gate insulating layer 2, and the first insulating film 112 are etched to remove the interlayer insulating film 19, the gate insulating layer 2, and the first insulating film 112 from the area around the semiconductor layer 1a. As a result, the wall surface 111 covering the surrounding of the semiconductor layer 1a and the pixel electrodes 9a side of the semiconductor layer 1a is formed, and the wall surface 111 reaches the second light-shielding layer 8a. At this time, the one side 10s of the first substrate 10 is also etched in a predetermined thickness while using the second light-shielding layer 8a as a mask. Thereafter, the etching mask Ml is removed.

Next, in step ST3 illustrated in FIG. 9, the insulating inner wall formation film 113 such as a silicon oxide film is formed, as a protective film, on the one side 10s of the first substrate 10, and the inner wall formation film 113 is layered on the wall surface 111. Next, in step ST4 (second step) illustrated in FIG. 9, a sacrifice film 114 such as a silicon film is formed to cover the wall surface 111. In the present embodiment, the sacrifice film 114 is formed to cover the wall surface 111 via the inner wall formation film 113.

Next, in step ST5 illustrated in FIG. 9, the sacrifice film 114 is patterned while an etching mask (not illustrated) is formed, and out of the sacrifice film 114, a majority of a portion overlapping with the semiconductor layer 1a in a plan view is removed. In the present embodiment, the sacrifice film 114 remains in the linkage portion 125 described with reference to FIG. 6 and a portion corresponding to the first bent portion 126 illustrated in FIG. 7 and the like, out of the region overlapping with the semiconductor layer 1a in a plan view. Out of the sacrifice film 114 and the inner wall formation film 113, a portion projected from the second light-shielding layer 8a is removed by etching.

Next, in step ST6 (third step) illustrated in FIG. 10, another part (outer wall formation film 115) different from the part of the insulating layer 110 (the interlayer insulating film 19, the gate insulating layer 2, and the first insulating film 112) is formed to cover the sacrifice film 114. The outer wall formation film 115 includes a silicon oxide film and the like.

Next, in step ST7 (fourth step) illustrated in FIG. 10, etching is performed while an etching mask (not illustrated) is formed, and out of the other part (the outer wall formation film 115) of the insulating layer 110, the opening portion 115a is formed in a portion overlapping with the sacrifice film 114 in a plan view. In the present embodiment, the opening portion 115a is formed in a portion overlapping with the linkage portion 125 in a plan view.

Next, in step ST8 (fifth step) illustrated in FIG. 10, the sacrifice film 114 is removed by etching from the opening portion 115a to form the cavities 120 extending in the thickness direction at both sides in the width direction of the semiconductor layer 1a and at both sides in the length direction of the semiconductor layer 1a and surrounding the semiconductor layer 1a in a plan view. Drying etching having high etching selectivity with the silicon oxide film and the silicon film is performed in a vacuum atmosphere to remove the sacrifice film 114.

Next, in step ST9 illustrated in FIG. 10, the second insulating film 116 is formed on the one side 10s of the first substrate 10 and a surface of the outer wall formation film 115. As a result, the opening portion 115a is blocked by the second insulating film 116. Here, the second insulating film 116 is formed by a film formation method such as CVD method in the vacuum atmosphere, and thus, the inside of the cavities 120 is sealed in a vacuum state.

Thereafter, as illustrated in FIG. 6, FIG. 7, FIG. 8, and the like, after the contact hole 11a that penetrates the second insulating film 116, the outer wall formation film 115, the inner wall formation film 113, and the first insulating film 112, and the contact hole 11b that penetrates the second insulating film 116 and the outer wall formation film 115 are formed, the scan line 3a is formed. As a result, the scan line 3a electrically couples the gate electrode 31a and the second light-shielding layer 8a.

After this, the inter-layer insulating film, various types of wirings, and the like are formed, and thereafter, a well-known step such as a step of facing the first substrate 10 and the second substrate 20 via the electro-optical layer 80 is performed to complete the electro-optical device 100.

Main Effects of Embodiment

As described above, in the electro-optical device 100 according to the present embodiment, a whole of the semiconductor layer 1a of the transistor 30 overlaps with the first light-shielding layer such as the scan line 3a and the data line 6a and the second light-shielding layer 8a in a plan view, and thus, the light moving toward to semiconductor layer 1a from the pixel electrodes 9a side and the first substrate 10 side can be shielded by the first light-shielding layer and the second light-shielding layer 8a.

Further, inside the insulating layer 110 formed on the one side 10s of the first substrate 10, the cavities 120 are provided which extend in the thickness direction at both sides in the width direction of the semiconductor layer 1a and at both sides in the length direction of the semiconductor layer 1a and surround the semiconductor layer 1a in a plan view. Thus, light attempting to enter the semiconductor layer 1a from the width direction of the semiconductor layer 1a can be shielded by utilizing reflection at a boundary surface between the cavities 120 and the insulating layer 110, and light advancing toward the semiconductor layer 1a from the length direction of the semiconductor layer 1a or the direction diagonally inclined relative to the length direction can be shielded by reflection at a boundary surface between the cavities 120 and the insulating layer 110. That is, light advancing toward not only the channel region 1i but also the semiconductor layer 1a can be shielded over the entire circumference. Therefore, it is possible to further prevent light from entering the semiconductor layer 1a of the transistor 30, which further prevents occurrence of optical leakage current in the transistor 30.

In other words, in a plan view, at both sides in the width direction of the semiconductor layer 1a and at both sides in the length direction of the semiconductor layer 1a, the semiconductor layer 1a and the insulating layer (the outer wall formation film 115 and the second insulating film 116) covering the semiconductor layer 1a are separated. Thus, the light attempting to enter the semiconductor layer 1a from the width direction of the semiconductor layer 1a can be shielded by utilizing reflection at the wall surface of the outer wall formation film 115, and the light advancing toward the semiconductor layer 1a from the length direction of the semiconductor layer 1a or the direction diagonally inclined relative to the length direction can be shielded by reflection at the wall surface of the outer wall formation film 115. Therefore, it is possible to further prevent light from entering the semiconductor layer 1a of the transistor 30, which further prevents occurrence of optical leakage current in the transistor 30.

Further, the cavities 120 can be provided in a region overlapping, in a plan view, with at least one of the first light-shielding layer such as the scan line 3a, the data line 6a, the first capacitor line 51a, and the second capacitor line 52a, and the second light-shielding layer 8a. This inhibits occurrence of optical leakage current without narrowing the aperture region 108b (transmissive region) of each pixel.

Further, inside of the cavities 120 is vacuum, and thus, a semiconductor process in a vacuum can be utilized to block the cavities 120. Therefore, as compared to a case where the inside of the cavities 120 is an air space, the cavities 120 can be more easily formed.

In the present embodiment, the cavities 120 are provided from a position on the first substrate 10 side relative to the semiconductor layer 1a to a position on the pixel electrodes 9a side relative to the semiconductor layer 1a, in the thickness direction, and thus, light attempting to enter the semiconductor layer 1a can be shielded by reflection at the boundary surface between the cavities 120 and the insulating layer 110. Further, the semiconductor layer 1a is positioned behind at least one of the second light-shielding layer 8a and the cavities 120 when viewed from any direction on the first substrate 10 side. Thus, even when an optical feedback formed as a result of the light output from the electro-optical device 100 entering again the electro-optical device 100 after being reflected by an optical element and the like advances from the side of the first substrate 10 toward the semiconductor layer 1a, such light can be shielded by the reflection at the boundary surface between the cavities 120 and the insulating layer 110 or by the second light-shielding layer 8a.

Further, the cavities 120 are provided up to a position on the pixel electrode 9a side relative to the gate electrode 31a provided at the pixel electrode 9a side relative to the semiconductor layer 1a of the transistor 30, toward the pixel electrodes 9a. In this case also, the scan line 3a is formed on the surface of the second insulating film 116 covering the gate electrode 31a on the pixel electrodes 9a side, and thus, the scan line 3a is electrically coupled to the gate electrode 31a via the contact hole 11a that penetrates the second insulating film 116, the outer wall formation film 115, the inner wall formation film 113, and the first insulating film 112. Therefore, it is possible to avoid the scan line 3a from being broken by the cavities 120.

The first end 121 being the end of the cavities 120 on the pixel electrodes 9a side includes the first bent portion 126 bent toward an inside being a side where the semiconductor layer 1a is positioned in a plan view, and thus, even when light refracted by the surrounding light-shielding layer attempts to advance toward the semiconductor layer 1a from the pixel electrodes 9a side, such light can be shielded by the reflection at the boundary surface between the first bent portion 126 of the cavities 120 and the insulating layer 110. Further, the second end 122 being the end of the cavities 120 on the first substrate 10 side includes the second bent portion 127 bent toward the outside being opposite to the side where the semiconductor layer 1a is positioned in a plan view, and thus, even when the light refracted by the surrounding light-shielding layer attempts to advance toward the semiconductor layer 1a from a gap between the second light-shielding layer 8a and the cavities 120, such light can be shielded by the reflection at the boundary surface between the second bent portion 127 of the cavities 120 and the insulating layer 110 or the light-shielding layer.

According to the manufacturing method described with reference to FIG. 9 and FIG. 10, after the sacrifice film 114 is formed to cover the wall surface 111 formed on the insulating film to cover the surrounding of the semiconductor layer 1a and the pixel electrodes 9a side of the semiconductor layer 1a via the inner wall formation film 113, the other insulating film (outer wall formation film 115) covering the sacrifice film 114 is formed, and the sacrifice film 114 is removed by etching from the opening portion 115a of the outer wall formation film 115 to form the cavities 120. Thus, it is possible to easily form the cavities 120 having a shape appropriate for light shielding, including surrounding the semiconductor layer 1a.

Modification of Present Disclosure

In the above embodiment, the wall surface of the cavities 120 on the semiconductor layer 1a side is configured of the inner wall formation film 113; however, the wall surface of the cavities 120 on the semiconductor layer 1a side may be configured of the interlayer insulating film 19, the gate insulating layer 2, and the first insulating film 112 positioned inside the cavities 120, without the inner wall formation film 113. In this case, the second end 122 of the cavities 120 on the first substrate 10 side is to contact the second light-shielding layer 8a. According to such a modification, it is possible to more surely prevent an optical feedback entering from the first substrate 10 side from entering the semiconductor layer 1a.

Other Embodiments

In the above embodiment, the cavities 120 are formed to surround the entire circumference of the semiconductor layer 1a in a plan view; however, as long as the cavities 120 extend at both sides in the width direction of the semiconductor layer 1a and at both sides in the length direction of the semiconductor layer 1a, a part thereof in the circumferential direction may be broken.

In the manufacturing method described with reference to FIG. 9 and FIG. 10, the sacrifice film 114 is patterned before the outer wall formation film 115 is formed; however, a method may be adopted where when the opening portion 115a is formed in the outer wall formation film 115, a region where the cavities 120 are not present, such as a region overlapping with the semiconductor layer 1a in a plan view is used as the opening portion 115a to etch the sacrifice film 114. In this case, in the region overlapping with the semiconductor layer 1a in a plan view, for example, the second insulating film 116 is formed in a region where the sacrifice film 114 is removed, and thus, the cavities 120 are not formed.

Installation Example to Electronic Apparatus

Figure 11:
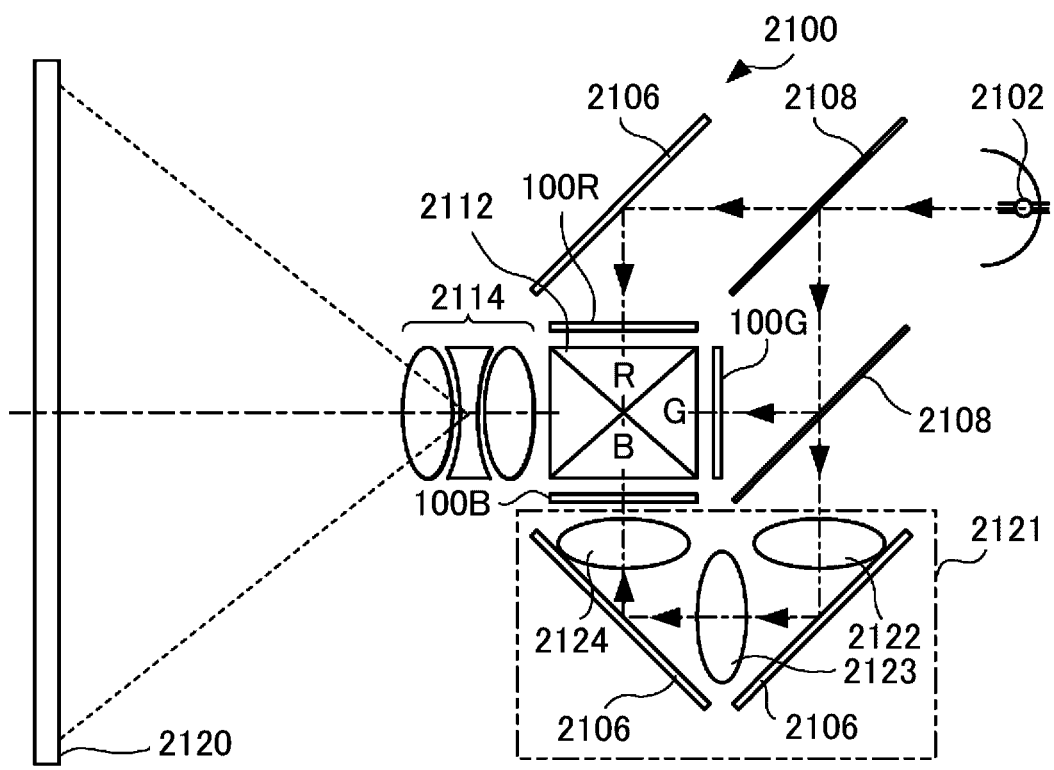
FIG. 11 is a schematic configuration view of a projection-type display device (electronic apparatus) using an electro-optical device to which the present disclosure is applied.

An electronic apparatus using the electro-optical device 100 according to the above-described embodiments will be described below. FIG. 11 is a schematic configuration view of a projection-type display device (electronic apparatus) using the electro-optical device 100 to which the present disclosure is applied. In FIG. 11, an optical element such as a polarizing plate is not illustrated. The projection-type display apparatus 2100 illustrated in FIG. 11 is an example of an electronic apparatus using the electro-optical device 100. The projection-type display device 2100, in which the electro-optical device 100 is used as a light valve, can conduct high-definition and bright display without making the apparatus large. As illustrated in this figure, a lamp unit 2102 (light-source unit) including a white light source such as a halogen lamp is provided inside the projection-type display apparatus 2100. Projection light emitted from the lamp unit 2102 is split into three primary colors of R (red), G (green), and B (blue) by three mirrors 2106 and two dichroic mirrors 2108 installed inside. The split incident light is guided to light valves 100R, 100G, and 100B corresponding to each of the primary colors, and then modulated. Note that since the light of the B color has a long optical path as compared to the other light of the R color and the G color, the light of the B color is guided via a relay lens system 2121 including an incidence lens 2122, a relay lens 2123, and an emission lens 2124 to prevent a loss due to the long optical path of the light of the B color.

The light modulated by each of the light valves 100R, 100G, and 100B is incident on a dichroic prism 2112 from three directions. Then, at the dichroic prism 2112, the light of the R color and the light of the B color are reflected at 90 degrees, and the light of the G color is transmitted. Accordingly, an image of the primary colors are synthesized, and subsequently a color image is projected on a screen 2120 by a projection lens group 2114 (projection optical system).

Other Projection-Type Display Apparatuses

Note that the projection-type display apparatus may include a configuration in which an LED light source or the like configured to emit light of each color is used as a light source unit and the light of each color emitted from the LED light source is supplied to another liquid-crystal device.

Other Electronic Apparatuses

The electronic apparatus including the electro-optical device 100 to which the present disclosure is applied is not limited to the projection-type display apparatus 2100 of the above-described embodiment. Examples of the electronic apparatus may include a projection-type Head Up Display (HUD), a direct-view type Head Mounted Display (HMD), a personal computer, a digital still camera, and a liquid crystal television.

What is claimed is:

1. An electro-optical device, comprising:
a substrate;
a pixel electrode;
a first light-shielding layer provided between the substrate and the pixel electrode;
a transistor extending between the substrate and the first light-shielding layer and including a semiconductor layer overlapping with the first light-shielding layer in a plan view;
a second light-shielding layer provided between the substrate and the semiconductor layer and overlapping with the semiconductor layer in a plan view;

an insulating layer provided between the substrate and the pixel electrode; and a cavity that entirely surrounds the semiconductor layer in a plan view, thereby, in the plan view, the semiconductor is entirely located within the cavity.

2. The electro-optical device according to claim 1, wherein the cavity surrounds the semiconductor layer in a plan view.

3. The electro-optical device according to claim 1, wherein an inside of the cavity is vacuum.

4. The electro-optical device according to claim 1, wherein the cavity is provided from a position on the substrate side relative to the semiconductor layer to a position on the pixel electrode side relative to the semiconductor layer, in a thickness direction being a direction perpendicular to the substrate.

5. The electro-optical device according to claim 4, wherein the semiconductor layer is positioned behind at least one of the light-shielding layer and the cavity when viewed from any direction from the substrate side.

6. The electro-optical device according to claim 4, wherein the cavity is provided up to a position on the pixel electrode side relative to a gate electrode provided on the pixel electrode side relative to the semiconductor layer of the transistor in the thickness direction, and the gate electrode is electrically coupled with a scan line formed as any one of the first light-shielding layer and the second light-shielding layer, from the pixel electrode side relative to the cavity.

7. The electro-optical device according to claim 1, wherein a first end being an end of the cavity on the pixel electrode side includes a first bent portion bent toward an inside where the semiconductor layer is positioned in a plan view.

8. The electro-optical device according to claim 1, wherein a second end being an end of the cavity on the substrate side includes a second bent portion bent toward an outside being opposite to where the semiconductor layer is positioned in a plan view.

9. The electro-optical device according to claim 1, wherein the insulating layer includes an outer wall formation film provided to cover the semiconductor layer and constituting a wall surface of the cavity opposite to the semiconductor layer, and the outer wall formation film is provided with an opening portion communicating with the cavity at a portion overlapping with the semiconductor layer on the pixel electrode side.

10. The electro-optical device according to claim 1, wherein the insulating layer includes an inner wall formation film provided to cover the semiconductor layer and constituting a wall surface of the cavity on the semiconductor layer side.

11. The electro-optical device according to claim 1, comprising:

an inner wall formation film provided to surround the semiconductor layer on the semiconductor layer side relative to the cavity and constituting a wall surface of the cavity on the semiconductor layer side.

12. An electro-optical device, comprising:

a substrate;

a pixel electrode;

a first light-shielding layer provided between the substrate and the pixel electrode;

a transistor extending between the substrate and the first light-shielding layer and including a semiconductor layer overlapping with the first light-shielding layer in a plan view;

a second light-shielding layer provided between the substrate and the semiconductor layer and overlapping with the semiconductor layer in a plan view; and an insulating layer provided between the substrate and the pixel electrode, wherein in a plan view, the semiconductor layer and the insulating layer are separated at both sides of the semiconductor layer in a width direction and at both sides of the semiconductor layer in a length direction.

13. An electronic apparatus comprising the electro-optical device according to claim 1.

* * * * *